(12) United States Patent
Agarwal et al.

(10) Patent No.: US 7,716,620 B2
(45) Date of Patent: May 11, 2010

(54) MOMENT-BASED METHOD AND SYSTEM FOR EVALUATION OF METAL LAYER TRANSIENT CURRENTS IN AN INTEGRATED CIRCUIT

(75) Inventors: Kanak B. Agarwal, Austin, TX (US); Ying Liu, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 466 days.

(21) Appl. No.: 11/682,450

(22) Filed: Mar. 6, 2007

(65) Prior Publication Data

US 2008/0222579 A1    Sep. 11, 2008

(51) Int. Cl.
*G06F 17/50*    (2006.01)
(52) U.S. Cl. .................... 716/12; 716/6; 716/7; 716/19
(58) Field of Classification Search ................... 716/6, 716/7, 12, 19
See application file for complete search history.

(56) References Cited

U.S. PATENT DOCUMENTS 5,469,366 A * 11/1995 Yang et al. .................... 716/6
6,769,100 B2     7/2004 Acar et al.

OTHER PUBLICATIONS

Blaauw, et al,. "Static Electromigration Analysis for On-Chip Signal Interconnects", IEEE Trans on Computer Aided Design of ICs and Systems, vol. 22, No. 1 Jan. 2003, pp. 39-48.
Nagaraj, et al., "A Practical Approach to Static Electromigration Signal Analysis" DAC, ACM, San Francisco, CA 1998.
Agarwal, et al., "Simple Metrics for Slew Rate of RC Circuits Based on Two Circuits Moments", DAC, ACM, Anaheim, CA 2003.
Liu, et al., "A Delay Metric for RC Circuits based on the Weibull Distribution", IEEE Press 2002 US.
Shao, et al., "Current Calculation on VLSI Signal Interconnects", Proceedings of the Sixth International Symposium on Quality Electronic Design, pp. 580-585, 2005, IEEE Press, Piscataway, NJ.
Shao, et al., "A Fast and Accurate Method for Interconnect Current Calculation", South Pacific DAC, pp. 37-42, 2003, Kitakyushu, Japan.

* cited by examiner

*Primary Examiner*—Thuan Do
(74) *Attorney, Agent, or Firm*—Mitch Harris, Atty at Law, LLC; Andrew M. Harris; Libby Z. Toub

(57) ABSTRACT

A moment-based method and system for evaluation of metal layer transient currents in an integrated circuit provides a computationally efficient evaluation of transient current magnitudes through each interconnect in the metal layer. The determinable magnitudes include peak, rms and average current, which can be used in subsequent reliability analyses. Interconnect path nodes are traversed and circuit moments are either retrieved from a previous interconnect delay analysis or are computed. For each pair of nodes, current moments are computed from the circuit moments. The average current is computed from the zero-order circuit moment and the peak and rms currents are obtained from expressions according to a lognormal or other distribution shape assumption for the current waveform at each node.

24 Claims, 5 Drawing Sheets

MOMENT-BASED METHOD AND SYSTEM FOR EVALUATION OF METAL LAYER TRANSIENT CURRENTS IN AN INTEGRATED CIRCUIT

BACKGROUND OF THE INVENTION

1. Technical Field

The present invention relates generally to circuit design and evaluation software, and more particularly, to a methodology and computer program that uses circuit moments to compute currents in a metal layer of an integrated circuit.

2. Description of the Related Art

Metal layer currents or "wire currents" in an integrated circuit must typically be evaluated for each design for a number of reasons. The metal layer interconnects must be properly sized to handle both peak current levels and power dissipation due to ohmic losses. Further, as design technology is scaled to decrease the circuit area, current densities in the interconnects increase, dramatically increasing problems due to electromigration. Electromigration causes movement of metal ions in the metal layer, deforming the conductors over time and potentially causing circuit failure. Voids formed in the conductors cause increased resistance and open circuits, and in particular, the reduced cross-section further increases current density and ohmic heating. Migration of the conductors toward other conductors can cause short circuits between conductors, and consequent failure of the integrated circuit. Both the peak and average values of current through a conductor are important factors in analysis of electromigration effects, and present reliability models typically require computation of the peak, root-mean-square (rms) and average current values for each conductor.

Complete determination of all currents in all interconnects in an integrated circuit is possible by simulating the circuit using a simulation program such as SPICE, but is time-consuming and requires an extensive amount of computing resources. Other techniques approximate the currents from timing models as triangular waveforms at each transient switching event and/or attempt to prune the set of interconnects for which currents are calculated, by selecting which interconnects are most likely to fail. However, for an analysis of potential electromigration failures and reliability values (mean time to failure), a full simulation is typically required. The timing model analyses will typically under or over-predict peak current values, depending on whether a conservative model is used. Pruning of the set of interconnects may miss conductors that have a high current stress vs. size and/or spacing.

It is therefore desirable to provide a method and system for accurately determining peak, average and rms current levels for all interconnects in metal layers of an integrated circuit without excessive computational burden.

SUMMARY OF THE INVENTION

The objective of accurately determining peak, average and rms current levels for all interconnects in metal layers of an integrated circuit is provided in a method, a computer system carrying out steps of the method, and a computer program product for carrying out the steps of the method on a computer system.

The method computes current moments representing coefficients of powers-of-s in a Laplacian representation of the interconnect current at each segment node in the model of the interconnect, which may be a resistor-capacitor (RC) tree model. The current moments are obtained from expressions in terms of the overlap resistance in the unique paths from the source node to each segment mode and differences from circuit moments for the nodes for a particular voltage waveform model, such as a source-saturated ramp applied to an end of the interconnect. The circuit moments can either be computed on-the-fly, or obtained from a previous interconnect delay analysis. The average current is then calculated from the lowest-order current moment and the rms and peak currents are calculated from closed-form expressions in terms of the current moments that are based on a distribution function current waveshape assumption, such as a lognormal distribution shape. The resulting values can be used in subsequent reliability analysis of the interconnect, which can then be combined to determine a reliability factor for the metal layer and/or can be used to inform design changes to interconnects having low reliability.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATIVE EMBODIMENT

The present invention concerns a technique for modeling transient current magnitudes, including peak, average and rms current values, within a metal layer of an integrated circuit. The results can be used in determining reliability of the integrated circuit metal layer, in particular, an evaluation of the reliability of the integrated circuit with respect to the effects of electromigration. The method, which is embodied in a computer system executing program instructions that carry out the method, may also be embodied in a computer program product, such as an optical disk containing the program instructions for loading into the computer's program memory.

Figure 1:
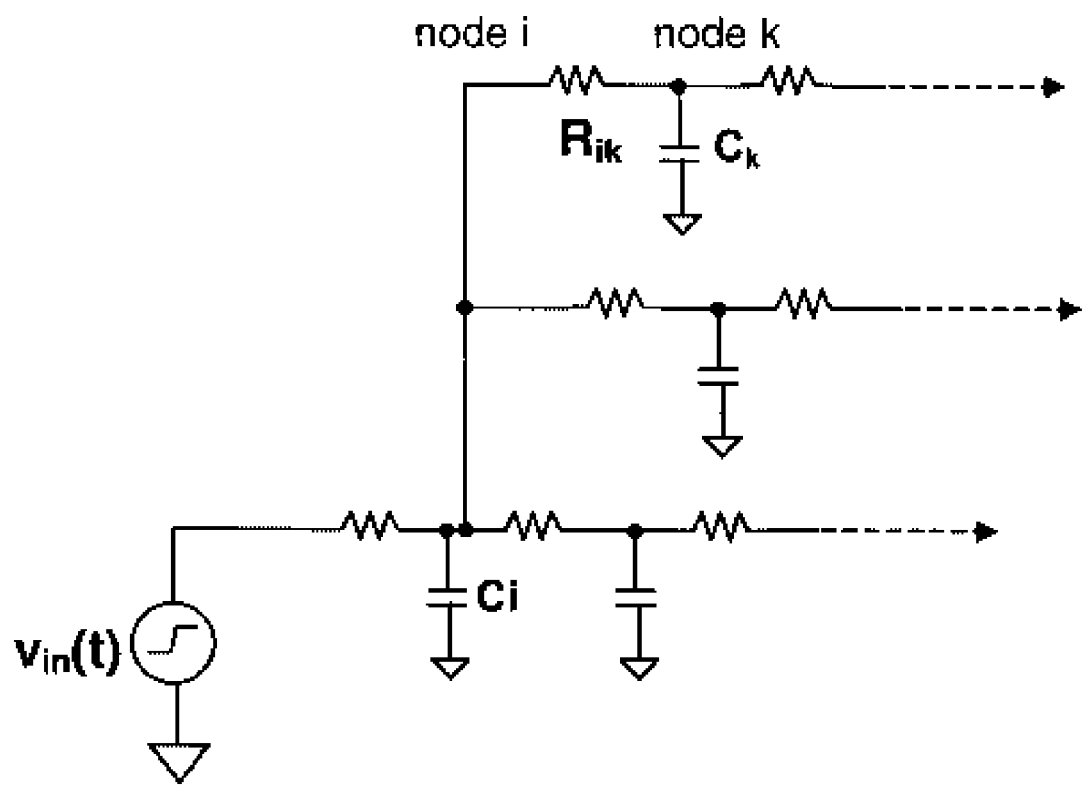
FIG. 1 is a circuit diagram illustrating a circuit model as used in a method in accordance with an embodiment of the invention.

Referring now to FIG. 1, a circuit model implemented by a computer-performed method in accordance with an embodiment of the invention is shown. The input to the depicted network is represented by a voltage source $v_{in}(t)$ and the interconnect is modeled as a set of resistors $R_{ik}$ between nodes representing endpoints of segments of the interconnect and shunt capacitances, e.g., $C_i$, $C_k$ at corresponding nodes node i, node k. The model is an AC model, and there is no DC current leakage path. Moment modeling for transient voltage analysis, for example for interconnect delay computations, has been used for circuit timing verification. The method of the present invention may further use the moments computed for a previous or contemporaneous voltage transient analysis, or may compute the circuit moments independently. In circuit moment transient voltage analysis, the voltage at the $i^{th}$ node is computed in the s-domain according to:

$$V_i(s) = H_i(s) \times V_{in}(s)$$

where $V_i(s)$ is the voltage at the $i^{th}$ circuit node and $V_{in}(s)$ is the input voltage. $H_i(s)$ is the Laplace transform of the impulse response $h(t)$ at the $i^{th}$ node and is given by $$H_i(s) = m_0^i + m_1^i s + m_2^i s^2 + m_3^i s^3 + \ldots = \sum_{k=0}^{0u} m_k^i s^k$$

according to the circuit moment model. $m_p^i$ is the $p^{th}$ moment of the transformed impulse response $H_i(s)$ at node i, which can be expressed as:

$$m_p^i = \sum_k (-R_{ik} C_k m_{p-1}^i)$$

for an RC tree, where $C_k$ is the shunt capacitance at node k as shown in the Figure, and $R_{ik}$ is the total overlap resistance in the unique paths from the source node to nodes i and k. The above equations are used in transient voltage analyses to obtain the voltage waveforms and in models that determine delay times using functions that are fit to the waveforms using the moment values.

In the present invention, current moments are computed to obtain the distribution of current through a metal layer interconnect Since the current flowing through a path from node i to node k, $I_{ik}(s)$, is given by $$I_{ik}(s) = \frac{V_i(s) - V_k(s)}{R_{ik}} \text{ then } I_{ik}(s) = \frac{V_{in}(s)}{R_{ik}}(H_i(s) - H_k(s))$$

which can be expanded in terms of the circuit moments as $$I_{ik}(s) = \frac{V_{in}(s)}{R_{ik}}(\Delta m_1^{ik} s + \Delta m_2^{ik} s^2 + \Delta m_3^{ik} s^3 \ldots)$$

where each term $$\Delta m_p^{ik} = (m_p^i - m_p^k)$$

represents the difference between the $p^{th}$ circuit moments of nodes i and k.

For a saturated ramp (constant source current) input voltage with rise-time $T_r$ and unit voltage, the input voltage in the s-domain is represented by $$V_{in}(s) = \frac{1 - e^{-sT_r}}{s^2 T_r}$$

The transient current between node i and node k can be expressed as $$j_{ik}(s) = m_0^{ik} + m_1^{ik} s + m_2^{ik} s^2$$

in which $m_p^{ik}$ is the p-th moment of the current wave form through the model resistance $R_{ik}$ between nodes i and k. The first three current moments through an element $R_{ik}$ for the linear ramp waveform above can be computed in terms of only higher-order moments $$m_0^{ik} = \frac{\Delta m_1^{ik}}{R_{ik}}$$

$$m_1^{ik} = \frac{1}{R_{ik}}\left(\Delta m_2^{ik} - \frac{T_r}{2}\Delta m_1^{ik}\right)$$

$$m_2^{ik} = \frac{1}{R_{ik}}\left(\Delta m_3^{ik} - \frac{T_r}{2}\Delta m_2^{ik} + \frac{T_r^2}{6}\Delta m_1^{ik}\right)$$

Although in the embodiment described herein, a linear ramp input voltage is used to derive the moments as expressed above, any time-varying voltage input to the circuit can be easily analyzed and expressions for the moments derived in a similar manner. The current moment value can then be easily calculated for any resistive element in an arbitrary RC tree. In general, the current moment calculation has minimal impact on the computational overhead, because the circuit moments for each node are generally already available from an earlier-performed interconnect delay analysis on the same circuits.

Once the current moments according to the model have been computed, the shape of the current waveform between two nodes can be determined, and the peak, average and rms current values obtained. However, computation time can be further reduced by providing a closed-form solution for the peak, average and rms current values and computing the values by a method according to an embodiment of the invention. The definition of a Laplace transform indicates that $$I_{ik}(s) = \int_0^\infty I_{ik}(t)e^{-kt}dt = \sum_{n=0}^\infty \frac{(-1)^n}{n!}s^n \int_0^\infty t^n \cdot I_{ik}(t)dt$$

and the individual current moments are terms of the above summation according to their corresponding power of s. For example, the first three individual current moments are given by $$\int_0^\infty I_{ik}(t)dt = m_{11}^{ik}$$

$$\int_0^\infty t \cdot I_{ik}(t)dt = -m_1^{ik}$$

$$\int_0^\infty t^2 \cdot I_{ik}(t)dt = m_2^{ik}$$

The zero-order moment is the total charge transfer from node i to node k due to the input ramp signal, and therefore the average current can be approximated as $$I_{ik}^{inz} = \frac{1}{T_C}\int_{11}^{T_C} I_{ik}(t)\,dt = \frac{1}{T_C}\int_{11}^{\infty} I_{ik}(t)\,dt = \frac{m_n^{ik}}{T_C}$$

where the integration limit $T_c$ is changed to infinity, since nodes i and k have substantially settled to their steady-state values after the current transient caused by the input ramp signal. Thus, the average current is readily available in a closed-form solution once the $0^{th}$ order current moment has been obtained.

However, the peak and rms values of the current require more information about the shape of the current waveform. Normalizing the current waveform according to the average value of the current provides a waveform that satisfies the following conditions, which are sufficient conditions to use a probability density function (pdf) to model the current waveform:

$$x_{ik}(t) \geq 0 \text{ for all } t$$

$$\int_0^\infty x_{ik}(t)\,dt = 1$$

The first condition is satisfied for the first-order nature of the RC circuit assumption, (i.e., there is no current undershoot), and the second is satisfied by the condition of normalization. The normalized current waveform can be expressed in the s-domain as $$X_{ik}(s) = \frac{I_{ik}(s)}{m_0^{ik}} = \left(1 + \frac{m_1^{ik}}{m_0^{ik}}s + \frac{m_2^{ik}}{m_0^{ik}}s^2 \ldots\right)$$

The shape of the waveform has been found to be modeled very accurately using a lognormal distribution function, which also provides closed-form solutions for the rms and peak values of current. The two-parameter lognormal density function is given by $$f(t) = \frac{1}{tS\sqrt{2\pi}}e^{-\frac{1}{2}\left(\frac{\ln t\;M}{S}\right)^2}$$

where $S>0$ and is known as the shape parameter, and where $M>0$ and is known as the scale parameter. The first two moments of a lognormal distribution are given by $$\int_0^\infty t \cdot f(t)\,dt = e^{M+\frac{S^2}{2}}$$

$$\int_0^\infty t^2 \cdot f(t)\,dt = e^{2(M+S^2)}$$

The above relations provide that corresponding integrals of the normalized current $x_{ik}(t)$ in the time domain can be expressed in terms of current moments from the above-given s-domain expression for current $X_{ik}(s)$ in terms of moments, thus:

$$\int_0^\infty t \cdot x_{ik}(t)\,dt = -\frac{m_1^{ik}}{m_0^{ik}}$$

$$\int_0^\infty t^2 \cdot x_{ik}(t)\,dt = \frac{2m_2^{ik}}{m_0^{ik}}$$

From the above expression, the parameters M and S of the lognormal distribution approximating the current waveform can be computed from $$M = \ln\left(\frac{(m_1^{ik})^2}{m_0^{ik}\sqrt{2m_2^{ik}m_0^{ik}}}\right)$$

$$S = \sqrt{\ln\left(\frac{2m_2^{ik}m_0^{ik}}{(m_1^{ik})^2}\right)}$$

which can be derived by equating the expressions for M and S and the s-domain expression for current $X_{ik}(s)$ in the integral equations above and taking the natural logarithm of both sides of the resulting equalities. Even though the above expressions only include the first three current moments, the higher-order moments on which the currents depend can also be computed and included in the model.

Once the shape and scale parameters of the lognormal distribution are known in terms of current moments, the current waveform $I_{ik}(t)$ can be modeled as $$I_{ik}(t) = m_0^{ik} \times x_{ik}(t) = \frac{in_0^{ik}}{iS\sqrt{2\pi}}e^{-\frac{1}{2}\left(\frac{\ln t-M}{S}\right)^2}$$

according to the lognormal distribution. The root-mean-square current value is $$I_{ik}^{rms} = \sqrt{\frac{1}{T_C}\int_0^{T_C} I_{ik}^2(t)\,dt} \approx \sqrt{\frac{1}{T_C}\int_0^{\infty} I_{ik}^2(t)\,dt}$$

which can be approximated by an integral over $[0:\infty]$ as described above for the average current computation. The above integral can be solved in a closed-form manner yielding the following expression for the root-mean-square current:

$$I_{ik}^{rms} = m_0^{ik}\sqrt{\frac{e^{-M+\frac{S^2}{2}}}{2\sqrt{\pi}\,ST_C}}$$

Finally, the peak current is the maximum value of the current during a switching event (modeled by the ramp input voltage above) and can also be calculated in closed-form with respect to the lognormal distribution model. From the probabilistic interpretation of the lognormal distribution, the peak value refers to the "mode" of the distribution. Using the analytical expression of the mode of a lognormal function, the following expression is obtained for the peak current:

$$I_{ik}^{peak} = m_0^{ik} \frac{e^{-M+\frac{S^2}{2}}}{\sqrt{2\pi} \, S}$$

The set of expressions for peak, average and rms current given above can then be used to calculate the average, root-mean-square and peak current densities required for electromigration-based reliability analysis of signal interconnects. Further, the techniques disclosed above can be used to study the effects of the line resistance by varying $R_{ik}$ and slew rate by varying $T_r$.

Figure 2A:
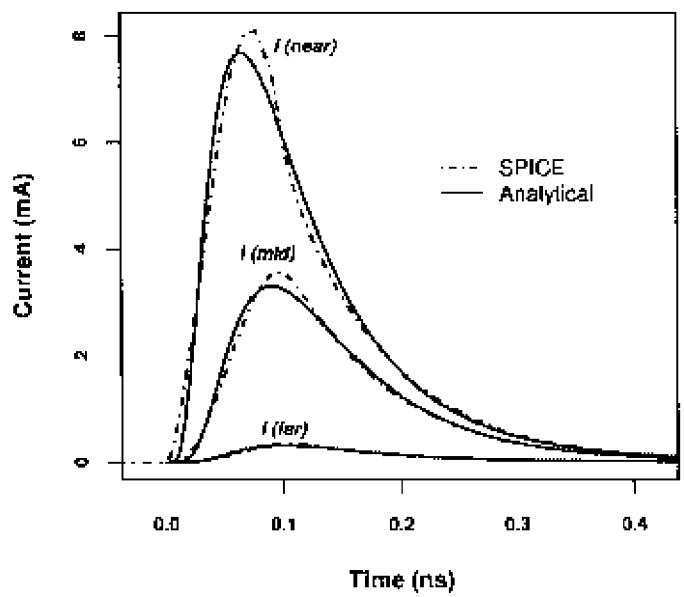
FIGS. 2A-2B and FIGS. 3A-3B are graphs depicting results of computations by modeling methods in accordance with embodiments of the present invention.
Figure 2B:
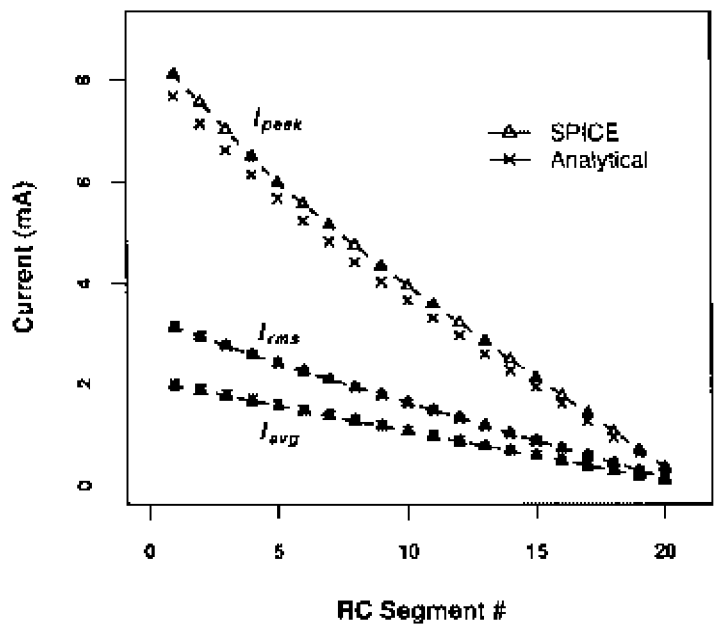

Referring now to FIG. 2A, results of a waveform reconstruction of the above-described lognormal distribution approximation are shown. The dashed line indicates a substantially ideal SPICE model result, and the solid line indicates the analytical result from a lognormal distribution embodiment of a method in accordance with the present invention as described above. The analytical current results shows close conformity with the SPICE model current results for both ends i(near), i(far) of the interconnect as well as the midpoint i(mid). Other simulations have confirmed that the result is a very close approximation to the actual current waveshape over the entire interconnect. FIG. 2B shows a fit between the analytical results for rms $I_{rms}$, average $I_{avg}$ and peak $I_{peak}$ current values, where the triangles show SPICE calculations, and crosses show the current values obtained from the analytical expressions in terms of current moments as detailed above.

Figure 3A:
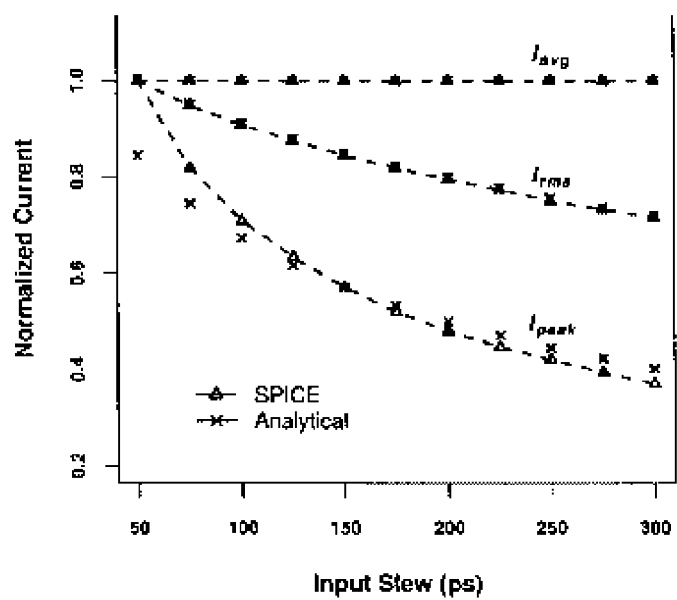
Figure 3B:
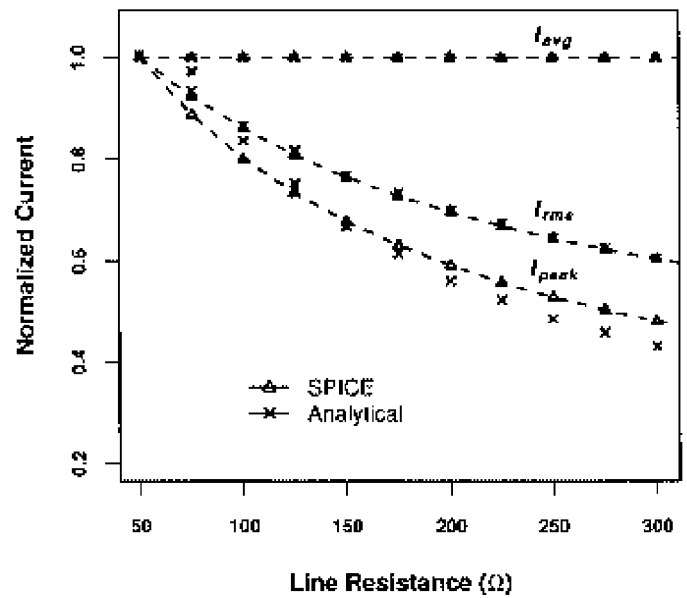

FIG. 3A shows results of a use of the analytical model to study the effects of variation in $T_r$. Again, SPICE simulation results are shown using triangles alongside the crosses indicating the analytical results for variations in the input voltage slew rate. FIG. 3B shows results of a use of the analytical model to study the effects of variation in total interconnect resistance. SPICE simulation results are shown again using triangles alongside the crosses indicating the analytical results for variations in the input voltage slew rate.

Figure 4:
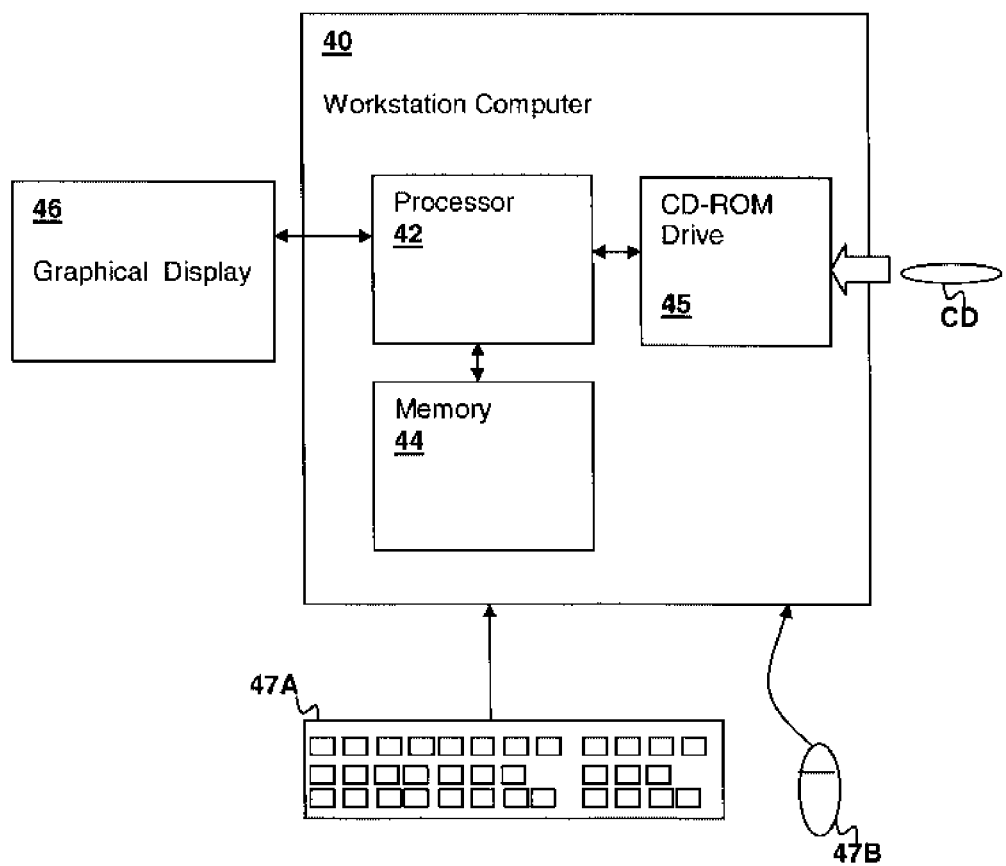
FIG. 4 is a flowchart depicting a method in accordance with an embodiment of the present invention.

Referring now to FIG. 4, a workstation computer system 40 is shown in which the methods of the present invention are carried out in accordance with an embodiment of the present invention, according to program instructions that may be embodied in a computer program product in accordance with a present invention, for example program instructions stored on a CD-ROM disc CD. Workstation computer system includes a processor 42 for executing the program instructions coupled to a memory 44 for storing the program instructions, data and results used in performing methods in accordance with embodiments of the present invention. Workstation computer system 40 also includes peripheral devices such as CD-ROM drive 45 for reading discs such as CD in order to load the program instructions into workstation computer 45. Input devices, such as a keyboard 47A and a mouse 47B are coupled to workstation computer system 40 for receiving user input. A graphical display 46 for displaying results such as the waveforms shown above in FIG. 2A and/or graphical/textual data such as is illustrated in FIG. 2B and FIGS. 3A-3B, along with other values determined in conformity with modeling methods in accordance with embodiments of the present invention. The depicted workstation computer 40 is only exemplary and illustrates one type of computer system and arrangement suitable for carrying out the methods of the present invention, and it is understood that program embodiments of the present invention may be remotely located and/or executed on a remote system such as an application server coupled to a local workstation that displays and/or uses the results of the above-described methods.

Figure 5:
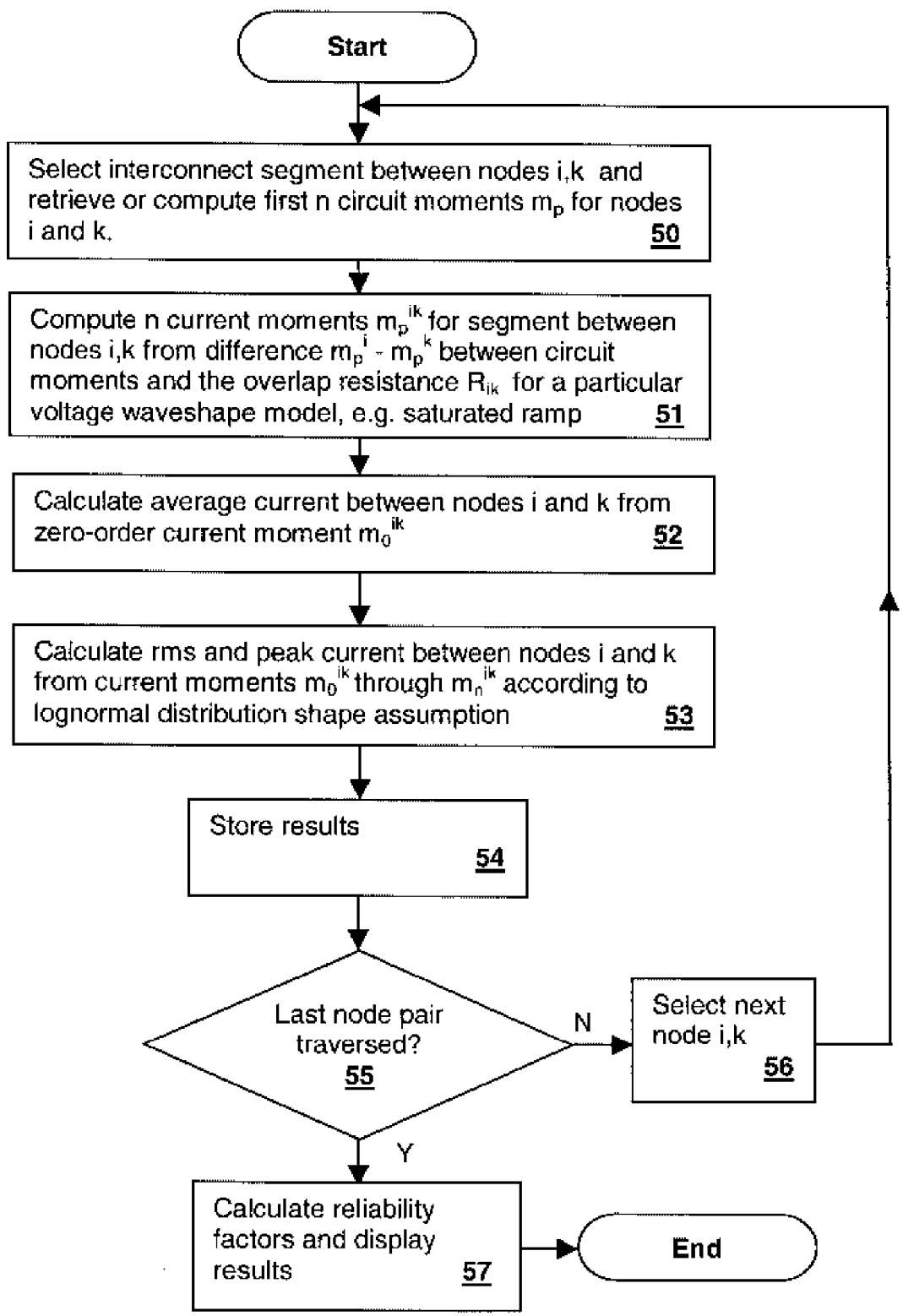
FIG. 5 is a block diagram depicting a computer system in which a method in accordance with an embodiment of the present invention is performed.

Referring now to FIG. 5, a method in accordance with an embodiment of the present invention is illustrated. First, an interconnect segment is selected between nodes i,k and the circuit moments $m_p$ are retrieved (from prior analyses) or computed for node i and node k (step 50). Next, n current moments $m_p^{ik}$ are computed for the segment between node i and node k from the difference between circuit moments $m_p^i - m_p^k$ for the nodes and the overlap resistance $R_{ik}$ in conformity with a particular input voltage model, e.g. a saturated ramp as described above (step 51). The average current is then calculated from the zero-order current moment $m_0^{ik}$ (step 52) and the rms and peak current values are calculated from the analytical expressions according to the assumption of lognormal (or other) distribution shape (step 53). The results are stored (step 54) and until the last node is traversed (decision 55), steps 50-54 are repeated after the next nodes i,k are selected (step 56). After the last node is traversed (decision 55), the reliability factors can be computed and the results displayed and/or used in further reliability computations (step 57).

While the invention has been particularly shown and described with reference to the preferred embodiment thereof, it will be understood by those skilled in the art that the foregoing and other changes in form, and details may be made therein without departing from the spirit and scope of the invention.

What is claimed is:

1. A computer-performed method for calculating a transient current magnitude in a metal layer of an integrated circuit, said method comprising:
    selecting an interconnect path segment of said metal layer;
    obtaining circuit moments for nodes corresponding to endpoints of said segment;
    specifying an input voltage waveshape;
    computing current moments from said circuit moments and said waveshape;
    calculating a current value for said segment from at least one of said current moments; and
    storing the current calculated current value for the segment in a memory of a computer system.

2. The computer-performed method of claim 1, wherein said computing current moments further computes said current moments from an overlap resistance of said segment.

3. The method of claim 2, wherein said computing current moments comprises:
    subtracting first circuit moments corresponding to a first one of said nodes from second circuit moments corresponding to a second one of said nodes to obtain current moment differences;
    collecting terms of an expansion corresponding to a predetermined voltage waveshape, wherein said terms are products of said current moment differences and coefficients determined in accordance with said predetermined voltage waveshape; and
    dividing a result of said collecting by said overlap resistance.

4. The method of claim 1, wherein said calculating a current value for said segment comprises computing an average value of said transient current magnitude from a lowest-order one of said current moments.

5. The method of claim 1, wherein said calculating a current value calculates said current value from an analytical expression corresponding to a predetermined function having characteristics according to a probability density function.

6. The method of claim 5, wherein said calculating a current value calculates an rms current value.

7. The method of claim 5, wherein said calculating a current value calculates a peak current value.

8. The method of claim 5, wherein said predetermined function is a lognormal distribution function.

9. A computer system, comprising a processor coupled to a memory for storing program instructions for execution by said processor for calculating a transient current magnitude in a metal layer of an integrated circuit, wherein said program instructions comprise program instructions for:
   selecting an interconnect path segment of said metal layer;
   obtaining circuit moments for nodes corresponding to endpoints of said segment;
   specifying an input voltage waveshape;
   computing current moments from said circuit moments and said waveshape;
   calculating a current value for said segment from at least one of said current moments; and
   storing the current calculated current value for the segment in a memory of a computer system.

10. The computer system of claim 9, wherein said program instructions for computing current moments further compute said current moments from an overlap resistance of said segment.

11. The computer system of claim 10, wherein said program instructions for computing current moments comprise program instructions for:
   subtracting first circuit moments corresponding to a first one of said nodes from second circuit moments corresponding to a second one of said nodes to obtain current moment differences;
   collecting terms of an expansion corresponding to a predetermined voltage waveshape, wherein said terms are products of said current moment differences and coefficients determined in accordance with said predetermined voltage waveshape; and
   dividing a result of said collecting by said overlap resistance.

12. The computer system of claim 9, wherein said program instructions for calculating a current value for said segment compute an average value of said transient current magnitude from a lowest-order one of said current moments.

13. The computer system of claim 9, wherein said program instructions for calculating a current value calculate said current value from an analytical expression corresponding to a predetermined function having characteristics according to a probability density function.

14. The computer program product of claim 13, wherein said program instructions for calculating a current value calculate an rms current value.

15. The computer system of claim 13, wherein said program instructions for calculating a current value calculate a peak current value.

16. The computer system of claim 13, wherein said predetermined function is a lognormal distribution function.

17. A computer program product comprising a computer-readable storage media containing program instructions for execution by a processor for calculating a transient current magnitude in a metal layer of an integrated circuit, said program instructions comprising program instructions for:
   selecting an interconnect path segment of said metal layer;
   obtaining circuit moments for nodes corresponding to endpoints of said segment;
   specifying an input voltage waveshape;
   computing current moments from said circuit moments and said waveshape;
   calculating a current value for said segment from at least one of said current moments; and
   storing the current calculated current value for the segment in a memory of a computer system.

18. The computer program product of claim 17, wherein said program instructions for computing current moments further compute said current moments from an overlap resistance of said segment.

19. The computer program product of claim 18, wherein said program instructions for computing current moments comprise program instructions for:
   subtracting first circuit moments corresponding to a first one of said nodes from second circuit moments corresponding to a second one of said nodes to obtain current moment differences;
   collecting terms of an expansion corresponding to a predetermined voltage waveshape, wherein said terms are products of said current moment differences and coefficients determined in accordance with said predetermined voltage waveshape; and
   dividing a result of said collecting by said overlap resistance.

20. The computer program product of claim 17, wherein said program instructions for calculating a current value for said segment compute an average value of said transient current magnitude from a lowest-order one of said current moments.

21. The computer program product of claim 17, wherein said program instructions for calculating a current value calculate said current value from an analytical expression corresponding to a predetermined function having characteristics according to a probability density function.

22. The computer program product of claim 21, wherein said program instructions for calculating a current value calculate an rms current value.

23. The computer system of claim 21, wherein said program instructions for calculating a current value calculate a peak current value.

24. The computer system of claim 21, wherein said predetermined function is a lognormal distribution function.

* * * * *